United States Patent
Yamada et al.

(10) Patent No.: US 9,034,729 B2
(45) Date of Patent: May 19, 2015

(54) SEMICONDUCTOR DEVICE AND METHOD OF MANUFACTURING THE SAME

(75) Inventors: Hiroshi Yamada, Ebina (JP); Katsuhiko Kitagawa, Ota (JP); Kazuo Okada, Ota (JP); Yuichi Morita, Yokosuka (JP); Hiroyuki Shinogi, Gifu (JP); Shinzo Ishibe, Gunma (JP); Yoshinori Seki, Gunma (JP); Takashi Noma, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 131 days.

(21) Appl. No.: 12/438,869

(22) PCT Filed: Aug. 22, 2007

(86) PCT No.: PCT/JP2007/066699
§ 371 (c)(1),
(2), (4) Date: Apr. 16, 2009

(87) PCT Pub. No.: WO2008/023824
PCT Pub. Date: Feb. 28, 2008

(65) Prior Publication Data
US 2009/0206349 A1     Aug. 20, 2009

(30) Foreign Application Priority Data

Aug. 25, 2006  (JP) .................................. 2006-229016
Feb. 26, 2007  (JP) .................................. 2007-045491

(51) Int. Cl.
*H01L 21/30* (2006.01)
*H01L 27/146* (2006.01)
*B81C 1/00* (2006.01)

(52) U.S. Cl.
CPC ...... *H01L 27/14618* (2013.01); *B81C 1/00269* (2013.01); *B81C 2203/0118* (2013.01); *H01L 27/14625* (2013.01); *H01L 27/14683* (2013.01); *H01L 27/14685* (2013.01)

(58) Field of Classification Search
CPC . H01L 31/0203; H01L 29/20; H01L 31/0376; B81C 1/00269; B81C 2203/0118
USPC ............... 361/820; 257/E21.505, E21.5, 222; 438/456, 465; 216/36
See application file for complete search history.

(56) References Cited

U.S. PATENT DOCUMENTS 5,907,151 A * 5/1999 Gramann et al. .......... 250/214.1
(Continued)

FOREIGN PATENT DOCUMENTS

JP         62-149155         7/1987
(Continued)

OTHER PUBLICATIONS

International Search Report, mailed Nov. 20, 2007, directed to counterpart International Patent Application No. PCT/JP2007/066699; 4 pages.

(Continued)

*Primary Examiner* — Caridad Everhart
(74) *Attorney, Agent, or Firm* — Robert F. Hightower

(57) ABSTRACT

An object of the invention is to provide a smaller semiconductor device of which the manufacturing process is simplified and the manufacturing cost is reduced and a method of manufacturing the same. Furthermore, an object of the invention is to provide a semiconductor device having a cavity. A first supporting body 5 having a penetration hole 6 penetrating it from the front surface to the back surface is attached to a front surface of a semiconductor substrate 2 with an adhesive layer 4 being interposed therebetween. A device element 1 and wiring layers 3 are formed on the front surface of the semiconductor substrate 2. A second supporting body 7 is attached to the first supporting body 5 with an adhesive layer 8 being interposed therebetween so as to cover the penetration hole 6. The device element 1 is sealed in a cavity 9 surrounded by the semiconductor substrate 2, the first supporting body 5 and the second supporting body 7.

9 Claims, 6 Drawing Sheets

(56) References Cited

U.S. PATENT DOCUMENTS

| | | | |
|---|---|---|---|
| 6,117,705 A * | 9/2000 | Glenn et al. | 438/106 |
| 6,268,231 B1 * | 7/2001 | Wetzel | 438/48 |
| 6,268,654 B1 | 7/2001 | Glenn et al. | |
| 6,319,745 B1 * | 11/2001 | Bertin et al. | 438/60 |
| 6,351,389 B1 | 2/2002 | Malladi | |
| 6,521,482 B1 * | 2/2003 | Hyoudo et al. | 438/110 |
| 6,531,341 B1 * | 3/2003 | Peterson et al. | 438/123 |
| 6,566,745 B1 | 5/2003 | Beyne et al. | |
| 6,596,117 B2 | 7/2003 | Hays et al. | |
| 6,630,661 B1 * | 10/2003 | Hoffman | 250/239 |
| 6,686,649 B1 * | 2/2004 | Mathews et al. | 257/659 |
| 6,727,643 B2 | 4/2004 | Suehiro | |
| 6,759,266 B1 * | 7/2004 | Hoffman | 438/64 |
| 6,885,107 B2 | 4/2005 | Kinsman | |
| 6,979,597 B2 | 12/2005 | Geefay et al. | |
| 7,026,758 B2 | 4/2006 | Guenther et al. | |
| 7,087,464 B2 * | 8/2006 | Yu et al. | 438/113 |
| 7,154,173 B2 | 12/2006 | Ikeda et al. | |
| 7,160,478 B2 * | 1/2007 | Leib et al. | 216/24 |
| 7,221,051 B2 * | 5/2007 | Ono et al. | 257/704 |
| 7,282,806 B2 | 10/2007 | Hembree et al. | |
| 7,564,496 B2 * | 7/2009 | Wolterink et al. | 348/340 |
| 7,576,427 B2 | 8/2009 | Potter | |
| 7,579,671 B2 | 8/2009 | Takao | |
| 7,638,813 B2 | 12/2009 | Kinsman | |
| 7,745,931 B2 | 6/2010 | Takao | |
| 2002/0132389 A1 * | 9/2002 | Patel et al. | 438/97 |
| 2003/0183921 A1 | 10/2003 | Komobuchi et al. | |
| 2004/0150062 A1 * | 8/2004 | Hsieh et al. | 257/433 |
| 2004/0150975 A1 * | 8/2004 | Hsieh et al. | 361/807 |
| 2004/0169466 A1 | 9/2004 | Suehiro et al. | |
| 2004/0217670 A1 * | 11/2004 | Ueda et al. | 310/313 R |
| 2004/0217703 A1 | 11/2004 | Wittmann et al. | |
| 2005/0012169 A1 * | 1/2005 | Ikeda et al. | 257/432 |
| 2005/0040519 A1 * | 2/2005 | Huang et al. | 257/712 |
| 2005/0101059 A1 * | 5/2005 | Yang | 438/127 |
| 2005/0156260 A1 * | 7/2005 | Partridge et al. | 257/414 |
| 2005/0161755 A1 * | 7/2005 | Huang et al. | 257/433 |
| 2005/0205898 A1 * | 9/2005 | Van Arendonk et al. | 257/222 |
| 2005/0236621 A1 * | 10/2005 | Maeda et al. | 257/59 |
| 2005/0239235 A1 * | 10/2005 | Appelt et al. | 438/118 |
| 2006/0006511 A1 | 1/2006 | Roh et al. | |
| 2006/0024919 A1 * | 2/2006 | Yang | 438/460 |
| 2006/0131501 A1 | 6/2006 | Ikushima et al. | |
| 2006/0157274 A1 * | 7/2006 | Stark | 174/564 |
| 2006/0214975 A1 | 9/2006 | Eguchi et al. | |
| 2007/0075417 A1 | 4/2007 | Hwang et al. | |
| 2008/0090335 A1 * | 4/2008 | Morimoto et al. | 438/118 |
| 2008/0277672 A1 * | 11/2008 | Hovey et al. | 257/82 |
| 2009/0008682 A1 * | 1/2009 | Kusunoki et al. | 257/292 |
| 2009/0189238 A1 * | 7/2009 | Kirby et al. | 257/433 |
| 2009/0321903 A1 | 12/2009 | Shinogi et al. | |
| 2010/0065929 A1 | 3/2010 | Okada et al. | |

FOREIGN PATENT DOCUMENTS

| | | | |
|---|---|---|---|
| JP | 08-078560 | 3/1996 | |
| JP | 09-061239 | 3/1997 | |
| JP | 11-351959 | 12/1999 | |
| JP | 2000-299396 A | 10/2000 | |
| JP | 2001-298102 A | 10/2001 | |
| JP | 2003-078121 A | 3/2003 | |
| JP | 2003-204005 | 7/2003 | |
| JP | 2005-019966 A | 1/2005 | |
| JP | 2005-072554 A | 3/2005 | |
| JP | 2005-209790 A | 8/2005 | |
| JP | 2006-032940 A | 2/2006 | |
| JP | 2006-100735 A | 4/2006 | |
| WO | WO9703459 A1 * | 1/1997 | G01P 1/02 |
| WO | WO-2006/040986 | 4/2006 | |

OTHER PUBLICATIONS

Shinogi, H. et al., U.S. Office Action mailed Apr. 29, 2011, directed to U.S. Appl. No. 12/438,888; 7 pages.

Okada, K. et al., U.S. Office Action mailed May 9, 2011, directed to U.S. Appl. No. 12/438,879; 11 pages.

Okada, K.et al., U.S. Office Action mailed Dec. 14, 2010, directed to U.S. Appl. No. 12/438,879; 6 pages.

Shinogi et al., U.S. Office Action mailed Aug. 29, 2011, directed to U.S. Appl. No. 12/438,888; 8 pages.

Okada et al., U.S. Office Action mailed Nov. 30, 2011, directed to U.S. Appl. No. 12/438,879; 6 pages.

Office Action mailed May 10, 2012, directed to U.S. Appl. No. 12/438,879; 9 pages.

Okada et al., U.S. Office Action mailed Sep. 28, 2012, directed to U.S. Appl. No. 12/438,879; 12 pages.

* cited by examiner

SEMICONDUCTOR DEVICE AND METHOD OF MANUFACTURING THE SAME

REFERENCE TO RELATED APPLICATIONS

This application is a national stage application under 35 USC 371 of International Application No. PCT/JP2007/066699, filed Aug. 22, 2007, which claims priority from Japanese Patent Application Nos. 2006-229016, filed Aug. 25, 2006, and 2007-045491, filed Feb. 26, 2007, the contents of which are incorporated herein by reference.

FIELD OF THE INVENTION

The invention relates to a semiconductor device and a method of manufacturing the same, particularly, a semiconductor device where an element formed on a semiconductor substrate is sealed and a method of manufacturing the same.

DESCRIPTION OF THE RELATED ART

In recent years, a device using MEMS (Micro Electro Mechanical Systems), a CCD (Charge Coupled Device) used for an image sensor or the like, a CMOS sensor, a sensor electrically detecting infrared radiation (IR sensor), or the like have been developed.

These device elements are formed on a semiconductor die, and this completed semiconductor die is sealed in a sealing body. As such a sealing structure, there are a can package which seals an element with a metal cap, a ceramic package which seals an element with a ceramic cap, a tubular package which seals an element therein, and so on.

The relevant technique is described in Japanese Patent Application Publication Nos. hei 11-351959 and hei 9-61239, for example.

The conventional sealing structure has a problem of being large as a whole. Furthermore, the conventional sealing structure is formed by separately providing a semiconductor die formed with a device element and a sealing body and assembling these. This provides a complex manufacturing process in mass production, and accordingly increases the manufacturing cost.

SUMMARY OF THE INVENTION

Therefore, an object of the invention is to provide a smaller semiconductor device of which the manufacturing process is simplified and the manufacturing cost is reduced and a method of manufacturing the same.

Furthermore, some semiconductor devices need have a cavity to effectively use. This is a case of sealing a device element in the cavity, for example. Other object of the invention is thus to provide a semiconductor device having a cavity.

The invention is to solve the above problems and the main features are as follows. In detail, a semiconductor device of the invention include: a semiconductor substrate; a first supporting body attached to a front surface of the semiconductor substrate with an adhesive layer being interposed therebetween and having a penetration hole penetrating the first supporting body from a front surface to a back surface; and a second supporting body attached to the first supporting body with an adhesive layer being interposed therebetween so as to cover the penetration hole, wherein a device element is sealed in a cavity surrounded by the semiconductor substrate, the first supporting body and the second supporting body.

A semiconductor device of the invention includes: a semiconductor substrate; and a supporting body attached to a front surface of the semiconductor substrate with an adhesive layer being interposed therebetween and having a penetration hole penetrating the supporting body from a front surface to a back surface, wherein a semiconductor element is formed on the semiconductor substrate corresponding to the penetration hole.

Furthermore, a method of manufacturing a semiconductor device of the invention includes: attaching a first supporting body to a front surface of a semiconductor substrate with an adhesive layer being interposed therebetween; forming a penetration hole penetrating the first supporting body from a front surface to a back surface by selectively removing a part of the first supporting body; and attaching a second supporting body to the first supporting body with an adhesive layer being interposed therebetween so as to cover the penetration hole, and sealing a device element in a cavity surrounded by the semiconductor substrate, the first supporting body and the second supporting body.

A method of manufacturing a semiconductor device of the invention includes: attaching a supporting body to a front surface of a semiconductor substrate with an adhesive layer being interposed therebetween; and forming a penetration hole penetrating the supporting body from a front surface to a back surface by selectively removing a part of the supporting body to remove the supporting body on a semiconductor element formed on the semiconductor substrate.

The method of the invention further includes removing the adhesive layer after the removing of the supporting body.

In the invention, the semiconductor device has, on the front surface of the semiconductor substrate, the first supporting body having the penetration hole penetrating the first supporting body from the front surface to the back surface, and the second supporting body attached to the first supporting body so as to cover the penetration hole, and these are integrated as a die. Therefore, the cavity is formed and the device becomes small as a whole.

Furthermore, since the device element is sealed in the process of manufacturing the semiconductor device, the assembling process is simplified more than conventional and the manufacturing cost is reduced.

Furthermore, by forming the penetration hole in the supporting body and by not disposing the supporting body on the semiconductor element made of a light receiving/emitting element, the refractive index is not influenced by the supporting body.

DETAILED DESCRIPTION OF THE INVENTION

An embodiment of the invention will be described referring to figures. FIGS. 1 to 5 are cross-sectional views showing a manufacturing process in order.

Figure 1:
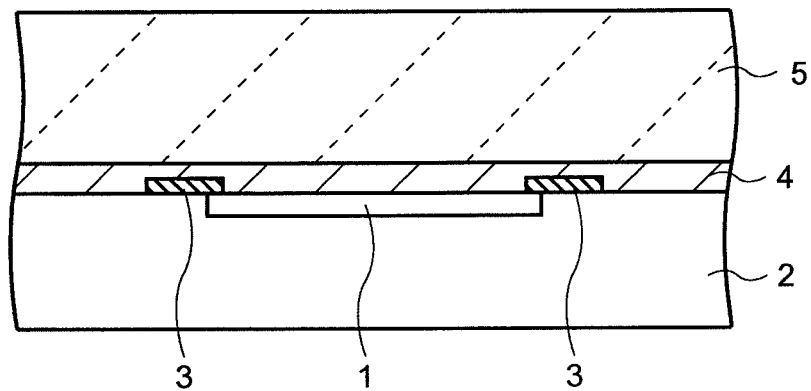
FIG. 1 is a cross-sectional view for explaining a semiconductor device of a first embodiment of the invention.

First, as shown in FIG. 1, a semiconductor substrate 2 made of silicon (Si) or the like is provided, where a device element 1 (e.g. a light receiving element such as CCD, an infrared ray sensor, a CMOS sensor or the like, a light emitting element, or other semiconductor element) is formed on the front surface.

The device element 1 may be a mechanical device such as a MEMS (Micro Electro Mechanical Systems) element. The MEMS is a device where a mechanical component, a sensor, an actuator, an electronic circuit or the like are integrated on a semiconductor substrate.

Then, an insulation film (e.g. a silicon oxide film or the like formed by a thermal oxidation method, a CVD method or the like) is formed on the front surface of the semiconductor substrate 2.

Then, wiring layers 3 (e.g. an aluminum layer or the like) are formed on this insulation film by, for example, a sputtering method. The wiring layers 3 are electrically connected to the device element 1 and conductive terminals 13 which will be described below, through which power is supplied to the device element 1.

A passivation film (not shown) is formed on the semiconductor substrate 2 including on the wiring layers 3.

Then, a first supporting body 5 is attached to the front surface of the semiconductor substrate 2 with an adhesive layer 4 such as epoxy resin, polyimide (e.g. photosensitive polyimide or the like), resist, acrylic or the like being interposed therebetween. The first supporting body 5 may be a board made of, for example, glass, quartz, ceramic, metal or the like, or made of resin (e.g. epoxy resin, acrylic resin, polyester resin or the like). The thickness is 150 μm, for example.

Figure 2:
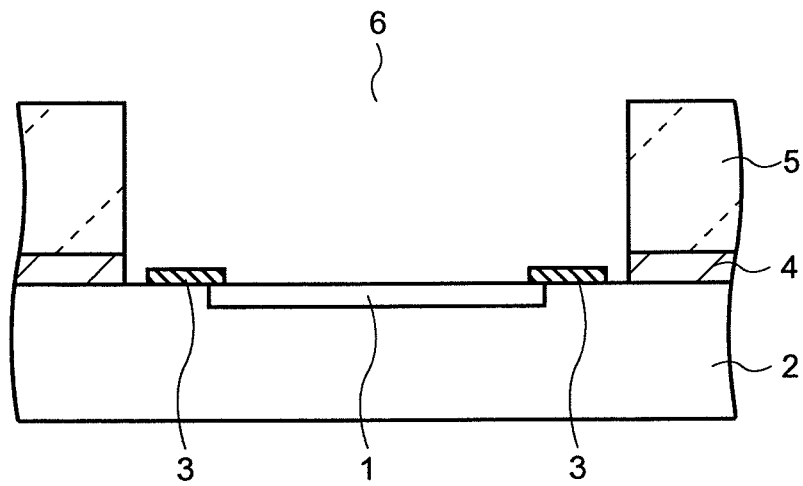
FIG. 2 is a cross-sectional view for explaining the semiconductor device of the first embodiment of the invention.

Then, etching, laser beam irradiation, sandblasting or the like are performed to a region of the first supporting body 5 which includes the elements at least (a region where the device element 1 and the wiring layers 3 are formed) to selectively remove the first supporting body 5. By this, a penetration hole 6 is formed penetrating the first supporting body 5 from the front surface to the back surface as shown in FIG. 2. In the embodiment, after the selective removing of the first supporting body 5, the adhesive layer 4 thereunder is also removed. A dry-etching method or a wet etching method may be used as a method of removing the adhesive layer 4.

When the first supporting body 5 is etched, for example, it is preferable to use a resist film, which is used for plating a conductive layer on a printed board, as a mask since it enhances etching tolerance.

Although the penetration hole 6 is formed so as to expose the wiring layers 3 in the embodiment described above, the penetration hole 6 may be formed with the wiring layers 3 being covered instead.

The penetration hole 6 forms an almost square of about 100 to 200 μm on each side in a plan view, for example, although the shape depends on use. However, the plan shape of the penetration hole 6 is not limited to a tetragon, and may be other polygon (a triangle, a pentagon or the like) or may include a curved portion like a circle. The sandblasting is a method of processing an object by applying a jet of fine particles such as alumina, silica or the like to the object.

Alternatively, a first supporting body where a penetration hole is formed in advance may be attached to the semiconductor substrate 2.

Then, a second supporting body 7 is provided. Like the first supporting body 5, the second supporting body 7 may be a board made of glass, quartz, ceramic or metal, or may be made of resin (e.g. epoxy resin, acrylic resin, polyester resin or the like). The thickness is about 150 μm, for example. When the device element 1 is a light receiving element or a light emitting element, the second supporting body 7 is made of a transparent or semitransparent material having a light transmitting property.

Furthermore, a predetermined thin film may be formed on the back surface of the second supporting body 7 (the surface facing the semiconductor substrate 2) according to use of the semiconductor device. For example, by forming a layer which transmits light of a specific wavelength only on the back surface of the second supporting body 7 by a film deposition technique such as a CVD (Chemical Vapor Deposition) method, a PVD (Physical Vapor Deposition) method or the like, the second supporting body 7 is provided with a function of a filter layer (e.g. an infrared ray filter or the like). Furthermore, when light should not enter the device element 1, a layer which absorbs light largely (e.g. a resin layer where a black pigment is added or the like) or a metal layer which reflects light (e.g. an aluminum layer, a copper layer or the like) may be formed on the back surface of the second supporting body 7 to provide the second supporting body 7 with a function of a light block layer.

Furthermore, by curving the front or back surface of the second supporting body 7 inward or outward, the second supporting body 7 is provided with a function of a lens. In detail, when the back surface of the second supporting body 7 (the surface facing the semiconductor substrate 2) is curved inward by etching, laser irradiation or the like, the second supporting body 7 is used as a planoconcave lens (a reverse direction). Furthermore, when the front surface (the surface not facing the semiconductor substrate 2) is curved inward, the second supporting body 7 is used as a planoconcave lens (a forward direction). Furthermore, when both the sides are curved inward, the second supporting body 7 is used as a double-concave lens. Furthermore, by changing the shape of the curve, the second supporting body 7 is used as a plano-convex lens or a double-convex lens.

Figure 3:
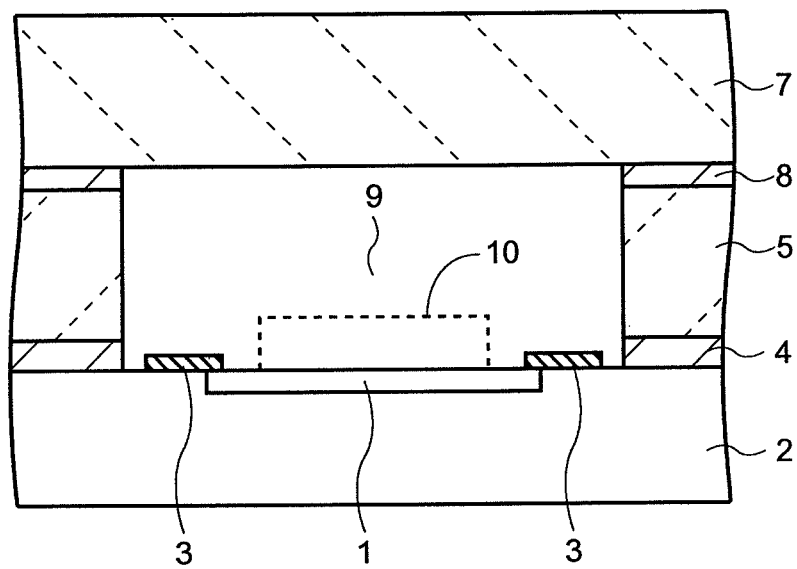
FIG. 3 is a cross-sectional view for explaining the semiconductor device of the first embodiment of the invention.

Then, as shown in FIG. 3, the second supporting body 7 is attached to the front surface of the first supporting body 5 with an adhesive layer 8 such as epoxy resin, polyimide (e.g. photosensitive polyimide or the like), resist, acrylic or the like being interposed therebetween. By this, the penetration hole 6 is covered by the second supporting body 7 and the penetration hole 6 is closed. The inner space surrounded by the semiconductor substrate 2, the first supporting body 5 and the second supporting body 7 is referred to as a cavity 9.

It is preferable to attach the first supporting body 5 and the second supporting body 7 under a decompression condition so as to make the cavity 9 substantially vacuum. Alternatively, these may be attached to each other in an atmosphere of inert gas (e.g. nitrogen or the like) to fill the cavity 9 with inert gas. The vacuum cavity 9 or the cavity 9 filled with inert gas prevents corrosion or degradation of the sealed device element 1 due to oxidation or the like.

The quality of the semiconductor device sometimes reduces when the adhesive layer 8 is located between the device element and the second supporting body 7. For example, in a case where the device element is a light receiving element or a light emitting element, when an unnecessary substance which prevents light entering the device element even slightly (or light irradiating from the device element) is located between the supporting body and the device element, there arises a problem that the operation quality of the semiconductor device reduces. For example, a required refractive index is not obtained. Furthermore, there arises a problem that the adhesive layer is degraded when light of a specific wavelength such as a Blu-ray is applied to the adhesive layer, and the operation quality of the semiconductor device reduces due to the degraded adhesive layer.

Therefore, when the second supporting body 7 is attached, the adhesive layer 8 may be formed on the attachment surface of the second supporting body 7 except the region formed with the penetration hole 6 (the cavity 9) only, instead of uniformly on the attachment surface of the second supporting body 7. This is because the degradation of the operation quality due to the adhesive layer 8 described above is minimized. The same is applied to the adhesive layer 4.

Alternatively, a device element 10 may be disposed on the semiconductor substrate 2 in the cavity 9 as shown in FIG. 3, after the penetration hole 6 is formed in the first supporting body 5 and before the first supporting body 5 and the second supporting body 7 are attached to each other. The device element 10 is a mechanical device such as a MEMS element, for example. Other microelement such as a filter member, a lens or the like as well as the device element may be disposed in the cavity 9. In this manner, by the process of sealing an additional device element or component in the cavity 9 before the process of attaching the second supporting body 7, various semiconductor devices may be completed. By adjusting the height of the cavity 9 (the thickness of the first supporting body 5), a thick element may be sealed on the semiconductor substrate 2.

Then, backgrinding is performed to the back surface of the semiconductor substrate 2 using a back surface grinder to reduce the thickness of the semiconductor substrate 2 to a predetermined thickness (e.g. about 100 μm). The grinding process may be replaced by an etching treatment or a combination of the grinder and the etching treatment. There is also a case where the grinding process is not necessary depending on application or specification of an end-product and the initial thickness of the provided semiconductor substrate 2.

Then, the semiconductor substrate 2 is selectively etched from the back surface side to the front surface side to form a plurality of via holes 11 reaching the wiring layers 3.

Then, an insulation film (not shown) and a barrier layer (e.g. a titanium layer, a titanium nitride layer, an alloy layer of these, or the like) are sequentially formed in the via holes 11, and penetrating electrodes 12 electrically connected to the wiring layers 3 (e.g. made of copper, aluminum, an aluminum alloy or the like) are formed by a plating method or a sputtering method. Then, a protection layer (not shown) (e.g. made of a solder resist or the like) is formed on the back surface of the semiconductor substrate 2, having openings in the regions for forming the conductive terminals 13.

Then, the conductive terminals 13 (e.g. made of solder, gold or the like) electrically connected to the penetrating electrodes 12 are formed in the openings of the protection layer (not shown) with a plating layer (e.g. made of nickel, gold, a lamination layer of these, or the like) being interposed therebetween. The conductive terminals 13 are formed by, for example, a screen printing method, a plating method or a dispensing method.

Figure 4:
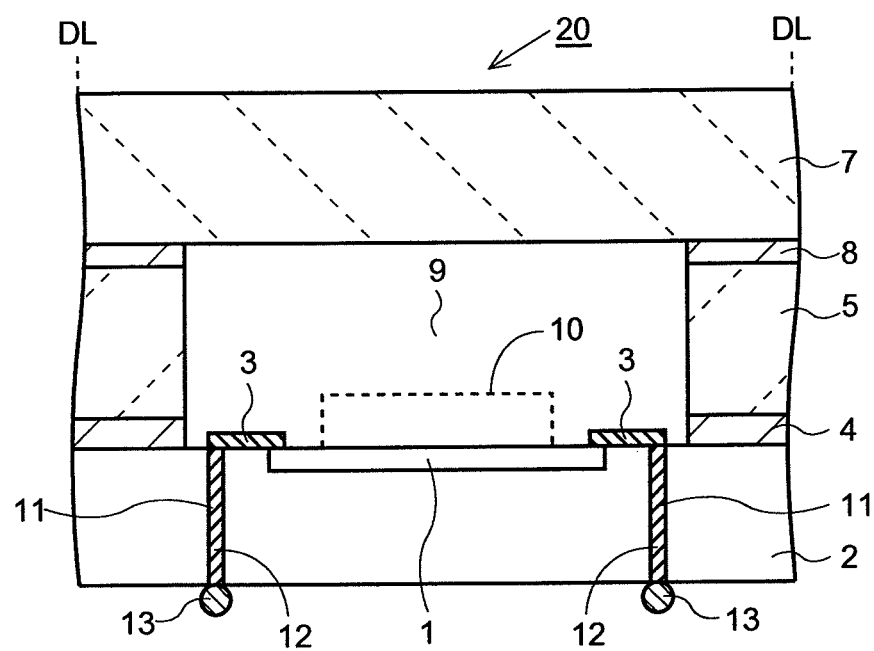
FIG. 4 is a cross-sectional view for explaining the semiconductor device of the first embodiment of the invention.
Figure 5:
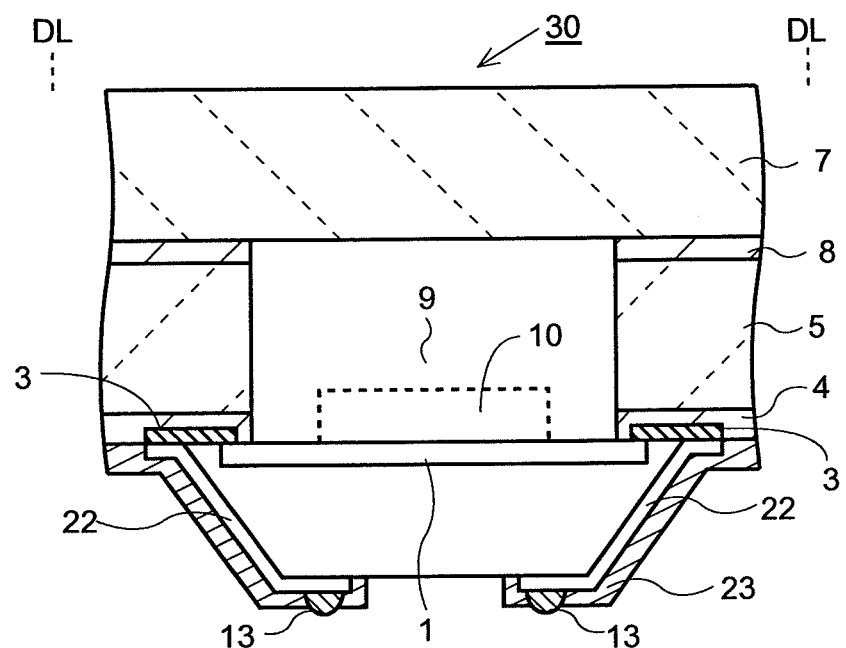
FIG. 5 is a cross-sectional view for explaining the semiconductor device of the first embodiment of the invention.

Although the conductive terminals 13 are formed immediately under the penetrating electrodes 12 in FIG. 4, back surface wirings may be formed first and the conductive terminals 13 may be formed on the back surface wirings. In detail, as shown in FIG. 5, the back surface of the semiconductor substrate 2 is selectively etched to expose the back surface of the wiring layers 3. Then, an insulation film (not shown) is formed on the side surface and the back surface of the semiconductor substrate 2, and then back surface wirings 22 connected to the back surfaces of the wiring layers 3 are formed on the side surface and the back surface of the semiconductor substrate 2 with an insulation film being interposed therebetween. Then, the protection films 23 are formed so as to cover the back surface wirings 22, and the conductive terminals 13 are formed in openings formed in the protection films 23. The insulation film under the wiring layers 3 and the passivation film on the wiring layers 3 are omitted in the figure.

Then, these are cut along a dicing line DL, thereby completing individual semiconductor devices 20 or semiconductor devices 30. As the method of dividing these into the individual semiconductor devices 20, 30, there are a dicing method, an etching method, a laser cutting method or the like. The completed semiconductor devices 20, 30 are mounted on a circuit board or the like where an external electrode is pattern-formed.

In this manner, the semiconductor device of the embodiment has the first supporting body 5 having the penetration hole 6 and the second supporting body 7 attached to the first supporting body 5 so as to cover the penetration hole 6, on the front surface of the semiconductor substrate 2 where the device element 1 is formed, and these are integrated as a die. The device element 1 is sealed in the cavity 9 surrounded by the semiconductor substrate 2, the first supporting body 5 and the second supporting body 7. Therefore, the device is small as a whole.

Furthermore, the device elements are sealed during the process of manufacturing the semiconductor device, and then divided into the plurality of semiconductor devices. Therefore, an assembling process after the dicing is simplified and the manufacturing cost is minimized.

Furthermore, since the space of the cavity 9 is freely increased or decreased by changing the thickness of the first supporting body 5, the cavity 9 is effectively utilized. For example, by disposing a filter member (e.g. a color filter, a filter which transmits light of a specific wavelength only, or the like) in the cavity 9, the device becomes small as whole.

Furthermore, in a case of a structure where a device element is sealed with a single supporting body, a mechanical damage at one portion is easily transferred to other portion and the strength of the supporting body is easily degraded. The mechanical damage means a damage occurring in the dicing process, for example. On the contrary, the structure of the embodiment does not seal a device element with a single supporting body, and seals a device element with two supporting bodies. Therefore, even when a mechanical damage occurs in one of the supporting bodies, this mechanical damage is less transferred to the other supporting body. Therefore, according to the embodiment, the strength of the supporting body is enhanced as a whole and the reliability of the semiconductor device is enhanced.

Next, a second embodiment of the invention will be described referring to FIGS. 6 to 8.

Figure 6:
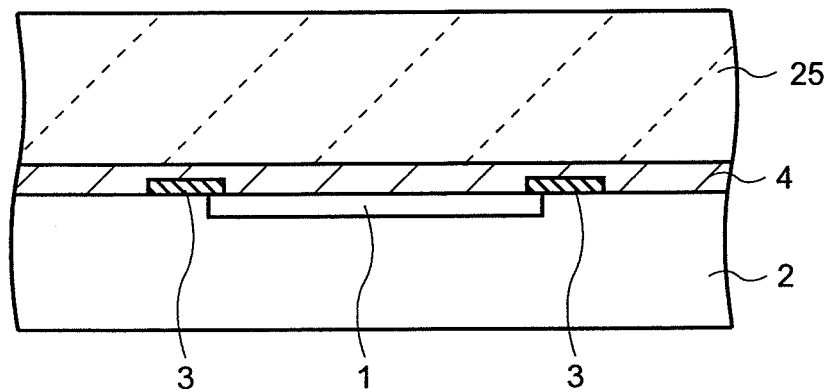
FIG. 6 is a cross-sectional view for explaining a semiconductor device of a second embodiment of the invention.
Figure 7:
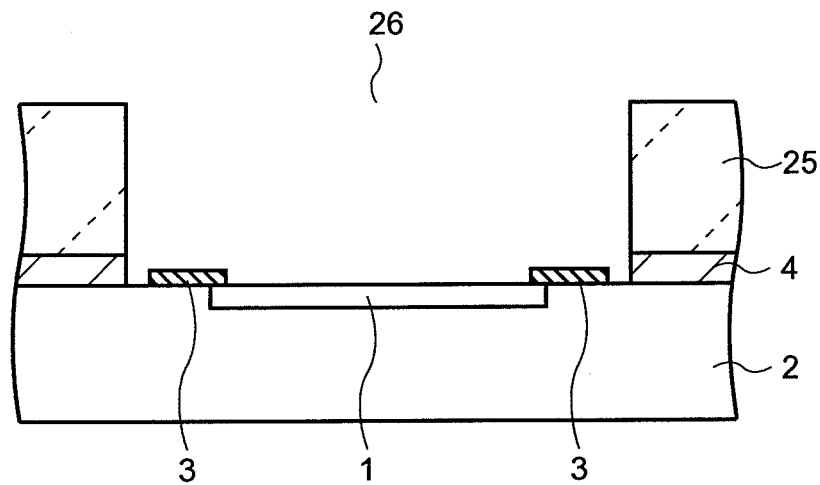
FIG. 7 is a cross-sectional view for explaining the semiconductor device of the second embodiment of the invention.

First, as shown in FIG. 6, a semiconductor substrate 2 made of silicon (Si) or the like is provided, where a device element 1 (e.g. a semiconductor element such as a light receiving element such as CCD, an infrared ray sensor, a CMOS sensor or the like, or a light emitting element) is formed on the front surface.

Then, an insulation film (e.g. a silicon oxide film formed by a thermal oxidation method, a CVD method or the like) is formed on the front surface of the semiconductor substrate 2.

Then, wiring layers 3 (e.g. an aluminum layer) are formed on this insulation film by, for example, a sputtering method. The wiring layers 3 are electrically connected to the device element 1 and conductive terminals 13 which will be described below, through which power is supplied to the device element 1.

A passivation film (not shown) is formed on the semiconductor substrate 2 including on the wiring layers 3.

Then, a supporting body 25 is attached to the front surface of the semiconductor substrate 2 with an adhesive layer 4 such as epoxy resin, polyimide (e.g. photosensitive polyimide), resist, acrylic or the like being interposed therebetween. The supporting body 25 may be a board made of, for example, glass, quartz, ceramic, metal or the like, or made of resin (e.g. epoxy resin, acrylic resin, polyester resin). The thickness is 150 μm, for example.

Then, etching, laser beam irradiation, sandblasting or the like are performed to a region of the supporting body 25 which includes the elements at least (a region where the device element 1 and the wiring layers 3 are formed) to selectively remove the supporting body 25 on the device element 1. By this, a penetration hole 26 is formed penetrating the supporting body 25 from the front surface to the back surface as shown in FIG. 7. In the embodiment, after the selective removing of the supporting body 25, the adhesive layer 4 thereunder is also removed. At this time, a dry-etching method or a wet etching method may be used as a method of removing the adhesive layer 4.

When the supporting body 25 is etched, for example, it is preferable to use a resist film, which is used for plating a conductive layer on a printed board, as a mask since it enhances etching tolerance.

The penetration hole 26 forms an almost square of about 100 to 200 μm on each side in a plan view, for example, although the shape depends on use. However, the plan shape of the penetration hole 26 is not limited to a tetragon, and may be other polygon (a triangle, a pentagon or the like) or may include a curved portion like a circle.

As described above, in the embodiment, when the device element 1 is, for example, a light receiving element, the supporting body 25 and the adhesive layer 4 are not formed on the light receiving area by forming the penetration hole 26 in the supporting body 25, and thus loss of incident light due to reflection or the like is prevented. For example, when the supporting body 25 is made of glass, the refractive index is 1.4. When the supporting body 25 and the adhesive layer 4 are not formed in the light receiving area, the refractive index is 0 which is the refractive index of air.

Furthermore, since the penetration hole 26 is formed in the light receiving area, the material of the supporting body 25 is not limited to a transparent material, and the degree of freedom in the selection is increased.

Figure 8:
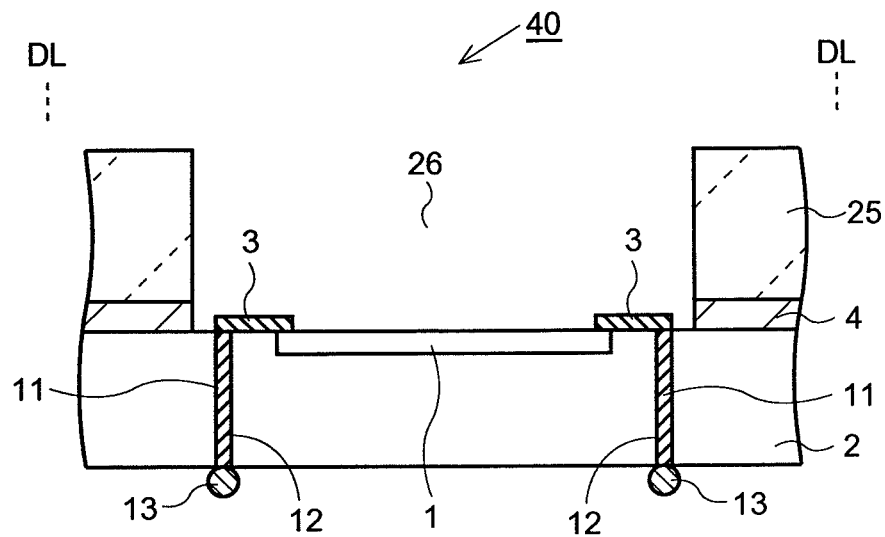
FIG. 8 is a cross-sectional view for explaining the semiconductor device of the second embodiment of the invention.
Figure 9:
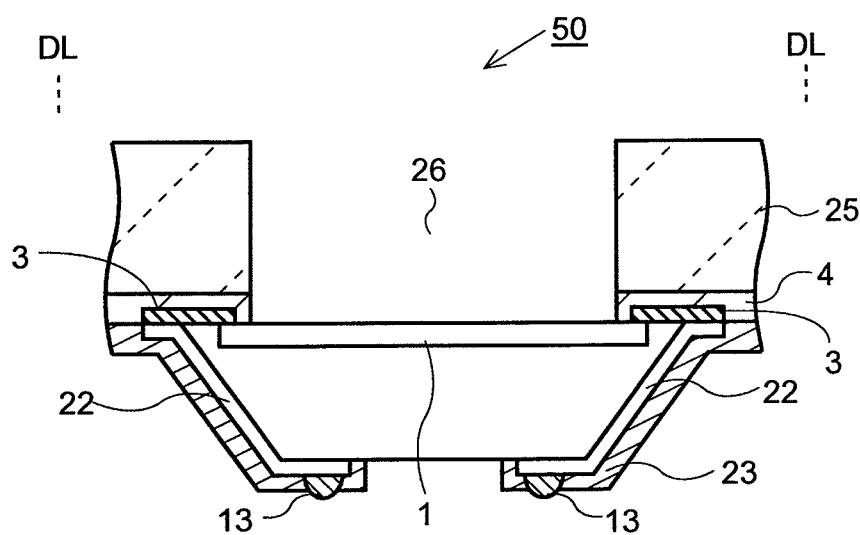
FIG. 9 is a cross-sectional view for explaining the semiconductor device of the second embodiment of the invention.

Thereafter, by forming the conductive terminals 13 connected to the wiring layers 3 as shown in FIGS. 8 and 9, the semiconductor device 40 or the semiconductor device 50 are formed.

Figure 10:
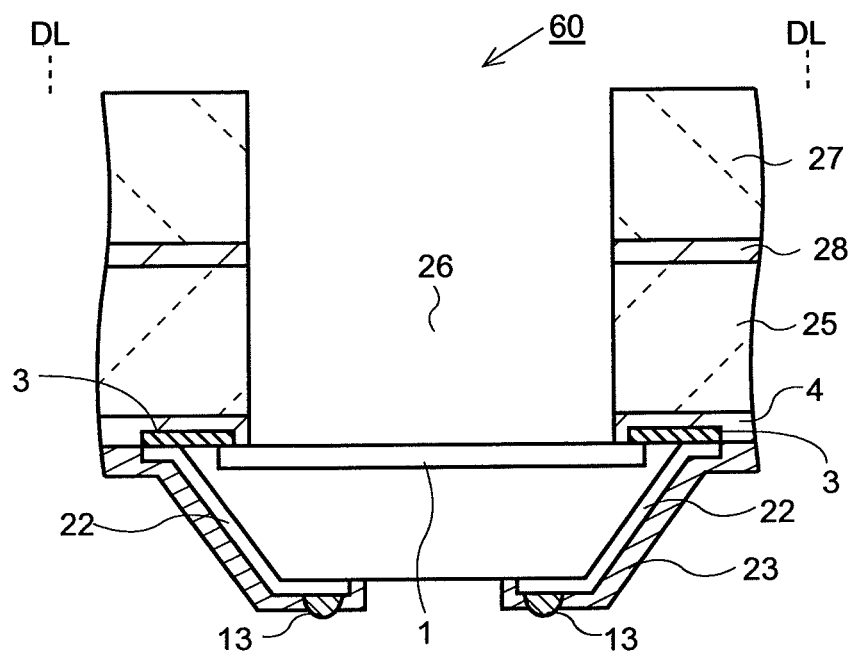
FIG. 10 is a cross-sectional view for explaining a semiconductor device of a third embodiment of the invention.

As shown in FIG. 10, a semiconductor device 60 may be formed having the second supporting body 27 on the supporting body 25. In this case, the processes of forming penetration holes in the second supporting body 27, removing an adhesive layer 28, forming penetration holes in the supporting body 25, and removing the adhesive layer 4 are repeated.

Although the supporting bodies 5, 7, 25 and 27 are attached using the adhesive layers 4, 8 and 28 respectively in the embodiments described above, the adhesive layers 4, 8 and 28 may be omitted by bonding the semiconductor substrate 2 and the supporting bodies 5, 7, 25 and 27 using a surface activation treatment, for example, an anode bonding method.

Furthermore, although the penetration hole 6 is formed in the supporting body 5 after the supporting body 5 is attached to the semiconductor substrate 2 in the embodiments described above, a supporting body having a penetration hole may be provided first and then attached to the semiconductor substrate 2.

Furthermore, for example, in a case of using a device in which a passivation film should not be used on a light receiving/emitting surface due to a light receiving/emitting element, a process of removing the passivation film formed on the light receiving/emitting surface may be added.

The invention is not limited to the embodiments described above, and modifications are possible within the scope of the invention. Although the BGA (Ball Grid Array) type semiconductor device is used in the above description, the invention may also be applied to an LGA (Land Grid Array) type semiconductor device which has no ball-shaped conductive terminal or other CSP type semiconductor device, or a flip chip type semiconductor device.

What is claimed is:

1. A method of manufacturing a semiconductor device, comprising:
    attaching a first supporting body to a semiconductor substrate with an adhesive layer, a metal wiring layer being formed on the semiconductor substrate;
    after the step of attaching the first supporting body, forming a penetration hole penetrating the first supporting body from a front surface to a back surface of the first supporting body by removing a part of the first supporting body;
    subsequently attaching a second supporting body to the first supporting body with an adhesive layer so as to cover the penetration hole, to seal a device element in a cavity formed by covering the penetration hole of the first supporting body by the semiconductor substrate and the second supporting body, and to include the metal wiring layer in the cavity; and
    wherein the two adhesive layers are each made of an organic material, and
    the first supporting body is made of an insulating material.

2. The method of claim 1, further comprising disposing the device element on the semiconductor substrate in the penetration hole after the formation of the penetration hole and before the attachment of the second supporting body.

3. The method of claim 1, wherein the device element comprises a MEMS element.

4. The method of claim 1 wherein the first supporting body is made of an insulating material includes forming the first supporting body from one of resin, glass, quartz, or ceramic.

5. The method of claim 1 further including the step of reducing a thickness of the semiconductor substrate subsequently to attaching the first supporting body and prior to attaching the second supporting body.

6. A method of manufacturing a semiconductor device, comprising:
    attaching a supporting body to a semiconductor substrate with an adhesive layer;
    subsequently to attaching the supporting body, forming a penetration hole penetrating the supporting body from a front surface to a back surface of the supporting body by removing a part of the supporting body so as to expose in the penetration hole a semiconductor element formed in the semiconductor substrate;

configuring the semiconductor device to be a finished device that has an open cavity comprising the penetration hole,
wherein the adhesive layer is made of an organic material, the supporting body is made of an insulating material, and the semiconductor element comprises a light receiving element or a light emitting element.

7. The method of claim 6 wherein the supporting body is made of an insulating material includes forming the first supporting body from one of resin, glass, quartz, or ceramic.

8. A method of manufacturing a semiconductor device, comprising:
   attaching a supporting body to a semiconductor substrate;
   subsequently to the step of attaching the supporting body, forming a penetration hole penetrating the supporting body from a front surface to a back surface of the supporting body by removing a part of the supporting body so as to expose in the penetration hole a semiconductor element formed in the semiconductor substrate;
   wherein the semiconductor element comprises a light receiving element or a light emitting element, and
   the supporting body is made of an insulating material.

9. The method of claim 6, further comprising removing at least a portion of the adhesive layer after the removing a part of the supporting body.

* * * * *